United States Patent
Flett

(10) Patent No.: US 7,973,387 B2
(45) Date of Patent: Jul. 5, 2011

(54) INSULATED GATE BIPOLAR TRANSISTOR

(75) Inventor: Fred Flett, Bloomfield, MI (US)

(73) Assignee: Continental Automotive Systems US, Inc., Auburn Hills (*) Notice: Subject to any disclaimer, the term of this patent is extended or adjusted under 35 U.S.C. 154(b) by 103 days.

(21) Appl. No.: 12/124,477

(22) Filed: May 21, 2008

(65) Prior Publication Data

US 2008/0303138 A1 Dec. 11, 2008

Related U.S. Application Data

(60) Provisional application No. 60/933,770, filed on Jun. 8, 2007.

(51) Int. Cl.
*H01L 29/72* (2006.01)

(52) U.S. Cl. ........ 257/577; 257/124; 257/288; 257/370; 257/587; 257/712

(58) Field of Classification Search .............. 257/124, 257/288, 370, 577, 587, 712
See application file for complete search history.

(56) References Cited

U.S. PATENT DOCUMENTS

| | | | |
|---|---|---|---|
| 2002/0023341 A1 | 2/2002 | Lorenz et al. | |
| 2003/0106924 A1 | 6/2003 | Nobori et al. | |
| 2005/0146027 A1 | 7/2005 | Kondou et al. | |
| 2007/0057284 A1* | 3/2007 | Casey et al. | 257/177 |
| 2007/0215903 A1 | 9/2007 | Sakamoto et al. | |

FOREIGN PATENT DOCUMENTS

| | | |
|---|---|---|
| EP | 1005083 | 5/2000 |
| FR | 2786657 | 6/2000 |
| FR | 2814907 | 4/2002 |

OTHER PUBLICATIONS

Gillot C et al., "Double-Sided Cooling for High Power IGBT Modules Using Flip Chip Technology", Industrial Applications Conference, 2000. Conference Record of the 2000 IEEE Oct. 8-12, 2000, Piscataway, NJ, USA, IEEE, vol. 5, Oct. 8, 2000, pp. 3016-3020, XP010521716.

International Search Report and Written Opinion mailed on Sep. 18, 2008.

* cited by examiner

*Primary Examiner* — Edward Wojciechowicz

(57) ABSTRACT

An insulated gate bipolar transistor includes bump pad connectors to provide thermal contact with a heat spreader for dissipating heat away form the insulated gate bipolar transistor.

16 Claims, 1 Drawing Sheet

INSULATED GATE BIPOLAR TRANSISTOR

CROSS REFERENCE TO RELATED APPLICATION

The application claims priority to U.S. Provisional Application No. 60/933,770 which was filed on Jun. 8, 2007.

BACKGROUND OF THE INVENTION

This invention relates to an insulated gate bipolar transistor.

It is known in the art that insulated gate bipolar transistors (IGBTs) have a limited life, and that one of the factors that influence the lifespan of an IGBT is the change in temperature seen by the junction as a result of flash heat. When an IGBT switches from its OFF state to its ON state and allows current to flow from its collector to its emitter, a flash of heat (referred to as "flash heat") is created. In current IGBTs the flash heat is initially isolated to the top metal layer of the IGBT, and, over time, is diffused through the junction into the base and ultimately diffuses into a silicone layer of the IGBT where it is then dissipated into the surrounding air. Diffusion through the silicon layer takes a relatively long time, and as such the temperature of the IGBT junction is raised significantly above its ambient temperature before the flash heat is fully dissipated.

The present construction methods for IGBTs utilize wire bound connectors to electrically connect the IGBT emitter to the electrical system. The wire bound connections have a high thermal resistance and constructions using this technique can only efficiently dissipate heat through the ceramic side of the IGBT into the silicone layer as the wirebound connections prevent efficient heat dissipation through the electrical connection side. Since the wirebound connections prevent the heat from being dissipated except through the silicone layer, little can be done in current designs to reduce the temperature change as a result of flash heat and therefore, the lifespan of current designs is limited.

SUMMARY OF THE INVENTION

Disclosed is an insulated gate bipolar transistor. The insulated gate bipolar transistor contains a heat spreader and cooling channels, as well as bump pad electrical connections.

These and other features of the present invention can be best understood from the following specification and drawings, the following of which is a brief description.

DETAILED DESCRIPTION OF THE PREFERRED EMBODIMENT

Figure 1:
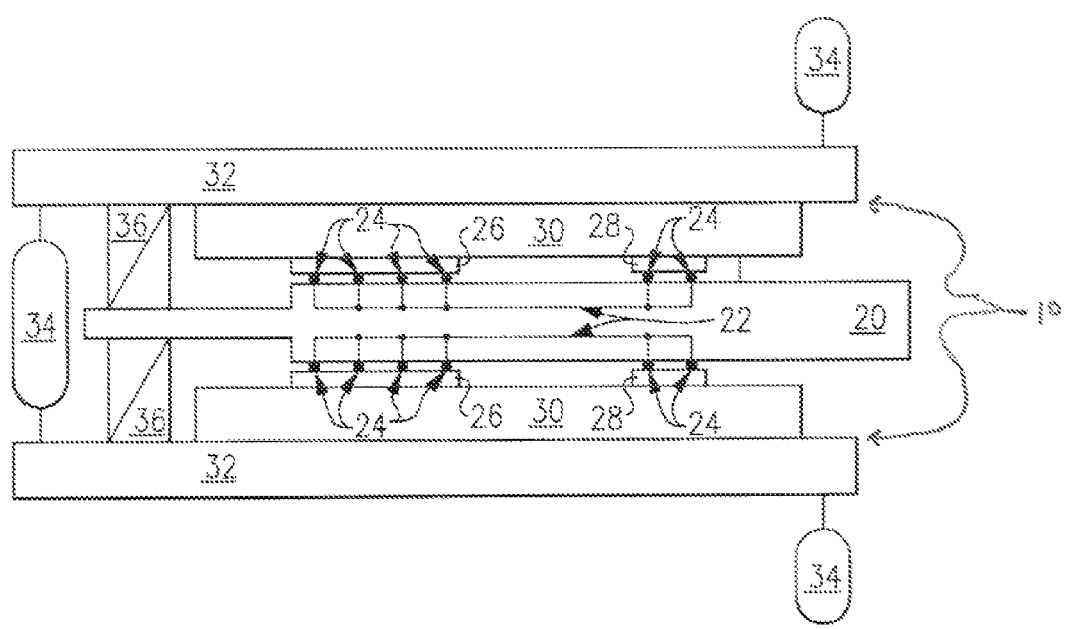
FIG. 1 is an illustration of an embodiment of the insulated gate bipolar transistor.

FIG. 1 illustrates an example inverter stack assembly 10 including two insulated gate bipolar transistors (IGBT) 26 and a single heat spreader 20 used to cool both IGBTs 26. The IGBTs 26 are mounted to separate silicon layers 30 with the heat spreader 20 sandwiched between the two IGBTs 26. Contained within the heat spreader 20 are electrical connections 22 for bump pad connectors 24. The bump pad connectors 24 connect the transistor gates 26 to diodes 28 that are also mounted to the silicon layers 30. The heat spreader 20 is flush with the transistor gates 26, thus allowing flash heat to dissipate through the heat spreader 20 in addition to dissipating through the silicon layers 30. The bump pad connectors 24 additionally connect the IGBTs 26 to the rest of the electrical system through electrical connections embedded in the heat spreader 20.

The bump pad connectors 24 are electrical contacts embedded in the heat spreader 20, the transistor gate 26, and the diode 28. When the electrical contacts are flush with each other the electrical circuit is closed. Additionally the bump pad connectors 24 are embedded in the heat spreader 20, the transistor gates 26, and diodes 28 such that when the bump pad connectors 24 are flush with each other, the heat spreader 20 is flush with both the transistor gates 26, and the diode 28. The flush orientation between the heat spreader 20 and the IGBTs 26 provides physical contact that provides for the absorption of at least a portion of the flash heat that occurs on the surface of the transistor gates 26. This physical configuration and orientation is not possible with wire bound electrical connections.

The example heat spreader 20 is a layer of polyimide material including the bump pad connectors 20. The heat spreader 20 is in thermal communication and connected to a cooling channel 32 through cooling spacers 36. The example cooling spacers 36 are composed of a thermally conductive material and provides heat to be siphoned from the heat spreader 20 and dissipated in the cooling channel 32. The cooling channel 32 is coupled to holding tanks 34, thereby allowing a cooling liquid to cycle between the cooling channel 32 and the holding tanks 34.

The example cooling channel 32 includes a thermally conductive wall and a hollow channel through which a cooling liquid cycles. The cooling channel 32 is in direct abutting contact with the silicon layer 30 in addition to contacting the cooling spacers 36. The direct contact with the silicon layers 30 provides for heat to be diffused through the silicon layer 30 efficiently as the heat diffusion into the cooling channel 32 is more efficient than heat diffusion into air. The diffusion of heat through the silicon layer 30 to the cooling channel additionally increases the efficiency and overall heat dispersion as heat is dissipated through both the heat spreader 20 and the silicon layer 30.

It is within the contemplation of this invention that the cooling channel 32 may be placed in thermal contact with silicone layers 30 on more than one side, and that the holding tanks 34 could provide cooling to additional IGBTs constructed using this design. Thermal contact with silicon layers 30 on more than one side of the cooling channel 32 provides for a stackable assembly 10, thereby minimizing the space required for multiple IGBTs and providing efficient use of the cooling liquid. Additionally, known alternate physical configurations and materials could be utilized to fabricate the heat spreader 20 and bump pad connectors 24 and are within the contemplation of this disclosure.

Although an embodiment of this invention has been disclosed, a worker of ordinary skill in this art would recognize that certain modifications would come within the scope of this invention. For that reason, the following claims should be studied to determine the true scope and content of this invention.

What is claimed is:
1. An insulated gate bipolar transistor assembly comprising;
   an insulated gate bipolar transistor;
   a cooling channel;
   a heat spreader thermally connected to said cooling channel; and at least one bump pad electrical connector embedded in the heat spreader and connecting an emitter of said insulated gate bipolar transistor with a diode through at least one electrical connection contained within the heat spreader, wherein the heat spreader physically contacts the insulated gate bipolar transistor on a bump pad electrical connection side.

2. The assembly as recited in claim 1, wherein said at least one bump pad electrical connector comprises;
multiple bump pad connectors contacting an emitter of the insulated gate bipolar transistor;
at least one bump pad connector contacting a diode; and
electrical connection between said multiple bump pad connections contacting said emitter and said at least one bump pad connection contacting said diode.

3. The assembly as recited in claim 1, wherein said cooling channel comprises;
an enclosed hollow channel at least partially defined by a thermally conductive material, the enclosed hollow channel defining a fluid flow passage for a liquid at least partially contained in said enclosed hollow channel.

4. The assembly as recited in claim 3, comprising cooling spacers between the heat spreader and the cooling channel for thermally connecting multiple insulated gate bipolar transistors to a fluid flow passing through said enclosed hollow channel.

5. The assembly as recited in claim 1, wherein said heat spreader is capable of absorbing at least a portion of flash heat from said insulated gate bipolar transistor.

6. The assembly as recited claim 1, comprising at least one cooling spacer defining a thermally conductive connection between said heat spreader and said cooling channel.

7. The assembly as recited in claim 6, wherein flash heat is drawn through the heat spreader and said at least one cooling spacer into said cooling channel.

8. The device of claim 1 wherein said cooling channel abuts a layer of silicon supporting at least one insulated gate bipolar transistors.

9. The assembly as recited in claim 1, wherein said heat spreader absorbs a portion of flash heat generated by the insulated gate bipolar transistor caused by switching between a powered state and a non-powered state.

10. The assembly as recited in claim 1, wherein said heat spreader is a layer of polymide material.

11. The assembly as recited in claim 1, wherein the cooling channel is in thermal contact with silicon layers on at least two sides.

12. The assembly as recited in claim 1, wherein the at least one electrical connection is non-wire bound.

13. The assembly as recited in claim 6, including at least one tank in fluid communication with said fluid spacers.

14. The assembly as recited in claim 8, wherein said diode is supported on said layer of silicon.

15. An insulated gate bipolar transistor assembly comprising;
a first insulated gate bipolar transistor and a second insulated gate bipolar transistor;
first and second cooling channels each defining fluid flow passages and spaced apart to define a space therebetween;
a heat spreader thermally connected to said cooling channel and disposed at least partially between the first and second cooling channels, wherein the heat spreader is in thermal contact with each of the first insulated gate bipolar transistor and the second insulated gate bipolar transistor; and
a first bump pad electrical connector contained in the heat spreader and connecting an emitter of said first insulated gate bipolar transistor with a first diode and a second bump pad electrical connector contained in the heat spreader and connecting an emitter of said second insulated gate bipolar transistor with a second diode, wherein the first insulated gate bipolar transistor and the second insulated gate bipolar transistor are on opposing sides of the heat spreader.

16. The assembly as recited in claim 15, wherein the heat spreader contacts the first insulated gate bipolar transistor and a second insulated gate bipolar transistor on a bump pad electrical connection side.

* * * * *